United States Patent [19]

Maas et al.

[11] Patent Number: 4,894,702

[45] Date of Patent: Jan. 16, 1990

[54] HIGH EFFICIENCY, SMALL GEOMETRY SEMICONDUCTOR DEVICES

[75] Inventors: Henricus G. R. Maas; Johannes W. A. Van Der Velden; Peter H. Kranen; Albertus T. M. Van De Goor; Date J. W. Noorlag, all of Eindhoven, Netherlands

[73] Assignee: U.S. Philips Corp., New York, N.Y.

[21] Appl. No.: 163,428

[22] Filed: Mar. 3, 1988

[30] Foreign Application Priority Data

Mar. 18, 1987 [NL] Netherlands ............ 8700640

[51] Int. Cl.$^4$ .............. H01L 29/72; H01L 29/04; H01L 29/40; H01L 23/48
[52] U.S. Cl. ................................ 357/34; 357/59; 357/65
[58] Field of Search .............. 357/34, 59, 65

[56] References Cited

U.S. PATENT DOCUMENTS 4,338,138  7/1982  Cavaliere et al. ............ 357/59 H
4,495,010  1/1985  Kronzer ....................... 357/59 H
4,792,837  12/1988  Zazzu .......................... 357/34

Primary Examiner—Eugene R. LaRoche
Assistant Examiner—Michael Shingleton
Attorney, Agent, or Firm—Steven R. Biren

[57] ABSTRACT

A semiconductor device comprising a first region, which is laterally bounded by a second region comprising a countersunk oxide layer and a highly doped polycrystalline silicon layer, which is disposed thereon and is covered by an oxide layer partly countersunk into it. The side edge of the polysilicon layer adjoins a contact zone, which is obtained by diffusion therefrom and is connected via a current path to a zone of a semiconductor circuit element. The upper side of the polysilicon layer is located at a higher level than that of the first region and the contact zone is connected to the said zone of the semiconductor circuit element via an intermediate region located in the first region below the second oxide layer and having a lower doping than the contact zone.

5 Claims, 7 Drawing Sheets

HIGH EFFICIENCY, SMALL GEOMETRY SEMICONDUCTOR DEVICES

BACKGROUND OF THE INVENTION

The invention relates to a semiconductor device comprising a monocrystalline semiconductor body of silicon, in which at least a first region of a first conductivity type is laterally bounded by a second region comprising a countersunk first oxide layer, a highly doped silicon layer of the second opposite conductivity type disposed thereon and a second oxide layer, which is disposed thereon, is at least partly countersunk into it and extends into the first region, the side edge of the said silicon layer adjoining a highly doped contact zone of the second conductivity type, which is connected via a current path to a semiconductor zone formed in said first region which is practically bounded in projection by the edge of the second oxide layer and forms part of a semiconductor circuit element, said silicon layer being connected to a connection conductor.

The invention further relates to a method of manufacturing the device.

A semiconductor device of the kind described is known from the publication "International Electron Device Meeting" (IEDM), 1982, p. 684–687. This publication discloses a bipolar transistor structure obtained in a self-aligned manner and having very small dimensions suitable for use in highly integrated (VLSI) circuits having a high packing density. A mesa, which is enclosed by a groove and whose upper side and walls are provided with a silicon nitride layer, is then formed from an n-type conducting epitaxial layer. Subsequently, the bottom of the groove is selectively oxidized and, after the mesa wall has been exposed, a polycrystalline silicon layer is provided on the assembly. It should be noted that in the present Application the term "polycrystalline silicon layer" is to be interpreted in the widest sense as a non-monocrystalline layer and includes also, for example, an amorphous silicon layer. The said silicon layer is then limited by planarization and plasma etching to the groove. Boron is then implanted into the polycrystalline silicon and the surface of the highly doped silicon electrode thus obtained is selectively oxidized, the base contact zone being formed by diffusion from the silicon electrode. Subsequently, the upper side of the mesa is exposed and base and emitter zones are formed therein, the base zone being connected via the said base contact zone on the wall of the mesa to the wide edge of the silicon electrode.

The disadvantage of this known construction and method is inter alia that the situation at the area of the connection between the silicon base electrode and the base zone strongly depends upon the size of the so-called "bird's beak" structure, which is obtained during the selective oxidation of the silicon electrode. As will be explained more fully hereinafter, with a narrow bird's beak the transistor will locally have a thicker base zone, while possibly even the emitter base pn junction partly extends in polycrystalline silicon. Also in connection with the comparatively high base doping, this will give rise to a low emitter-base breakdown voltage and will result in a poor linearity of the transistor. On the contrary, with a very wide bird's beak, the situation may arise that the connection between the base contact zone and the base zone is interrupted.

Further, in connection with the manufacturing method used, the upper side of the silicon electrode in this known device will always be located at a lower level than the upper surface of the mesa. In order to obtain a reasonable contact surface between the silicon electrode and the base contact zone, this connection must have a height of at least about 0.6 μm. For this purpose, the groove must be comparatively deep and the polycrystalline silicon layer must be comparatively thick.

The invention has inter alia for its object to provide an improved structure of a semiconductor device of the kind described, in which the connection with the side edge of the silicon electrode can be established in a reproducible manner and independently of the form of the bird's beak, as a result of which inter alia bipolar transistors having a high efficiency and very small dimensions can be obtained, which have a stable emitter-base junction and a good linearity. The invention can also be used in semiconductor devices other than bipolar transistors, for example MOS transistors, and further relates to a method of manufacturing such a device.

The invention is based inter alia on the recognition of the fact that the result aimed at can be obtained in that the connection with the side edge of the electrode is combined in a suitable manner with a zone or interstice, whose location and dimension can be fully determined in a self-aligned manner.

According to the invention, a semiconductor device of the general kind described above is characterized in that the upper side of the silicon layer is located at a higher level than the surface of the first region and in that the contact zone is connected to the said semiconductor zone via an intermediate region located in the first region at least in part below the second oxide layer and having a lower doping concentration than the contact zone.

Due to the fact that in the semiconductor device according to the invention the contact zone is connected not directly, but through an intermediate region, to the semiconductor zone of the second conductivity type forming part of the semiconductor circuit element, which intermediate region can be formed independently of the bird's beak forming part of the second oxide layer, the said problems caused by the bird's beak do not occur in a device according to the invention.

The invention further relates to a method of manufacturing the device, which method is characterized in that (a) a first anti-oxidation layer is provided on the surface of a silicon region of a first conductivity type, (b) a first layer of a first material is provided on the first anti-oxidation layer, (c) a pattern is formed from the first layer, (d) edge portions of a second material selectively etchable with respect to the first material are provided along the circumference of the first layer, (e) the uncovered part of the first anti-oxidation layer is removed, (f) a depression is etched into the exposed part of the silicon region, (g) a further anti-oxidation layer is provided on the assembly, (h) the further anti-oxidation layer is removed by plasma etching from all the surfaces parallel to the surface, (i) the silicon surfaces not covered by the further antioxidation layer are provided by thermal oxidation with a first oxide layer, (j) after the further anti-oxidation layer has been removed, the depression is filled by deposition and planarization with a highly doped silicon layer of the second conductivity type up to a level above the surface of the silicon region (k) the edge portions are removed by selective etching, (l) an intermediate region is formed in the silicon located below the edge portions by introduction of a dopant, (m) the exposed part of the first anti-oxidation layer is removed, (n) the first layer of the first material is removed by selective etching, and (o) the exposed silicon is provided by thermal oxidation with a second oxide layer, a contact zone of the second conductivity type being formed in the silicon region by diffusion from the highly doped silicon layer of the second conductivity type.

BRIEF DESCRIPTION OF THE DRAWINGS

The invention will now be described more fully with reference to several embodiments and the drawing, in which.

The Figures are purely schematic and are not drawn to scale. Corresponding parts are generally designated by the same reference numerals and semiconductor regions of the same conductivity type are generally cross-hatched in the same direction.

DESCRIPTION OF THE PREFERRED EMBODIMENTS

Figure 1:
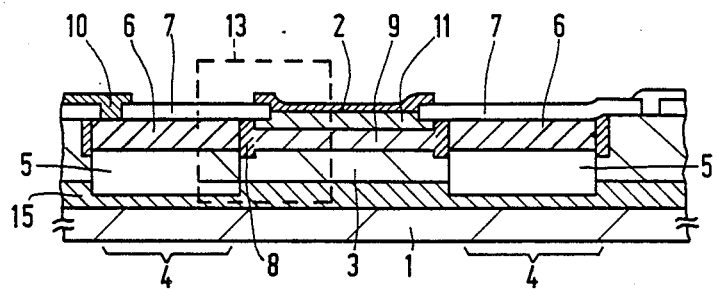
FIGS. 1, 1A and 1B show diagrammatically in cross-section parts of a known semiconductor device.

FIG. 1 shows diagrammatically in cross-section a part of a known semiconductor device. This device has a monocrystalline semiconductor body of silicon having a surface 2, of which a first region 3 of a first conductivity type, in this case the n-type, is laterally bounded by a second region 4. In this embodiment, the region 3 consists of an epitaxial layer, which is provided on a p-type substrate 1 and is separated therefrom by a highly doped n-type buried layer 15. The second region 4 comprises a countersunk first oxide layer 5, a highly doped polycrystalline silicon layer 6 of the second opposite conductivity type, in this case the p-conductivity type, disposed thereon and a second oxide layer 7, which is disposed on its countersunk is at least in part into it and extends into the first region 3. The side edge of the silicon layer 6 adjoins a highly doped p-type contact zone 8. This zone is connected via a current path, in the present known device directly to a semiconductor zone 9, in this embodiment of the second p-conductivity type, which is formed in the first region 3, is practically bounded in projection by the edge of the second oxide layer 7 and forms part of a semiconductor circuit element (in this case a bipolar transistor). The silicon layer 6 is connected to a connection conductor 10. The region 3 constitutes the collector zone, while the region 9 constitutes the base zone of a bipolar transistor, whose n-type emitter zone 11 is also practically bounded in projection by the edge of the oxide layer 7 due to the fact that both the base zone 9 and the emitter zone 11 are formed by introduction (implantation or diffusion) of activator atoms (donors and acceptors), while using the oxide layer 7 as a mask. A device of the kind described above is known from the aforementioned publication IEDM 1982, p. 684–687.

Figure 1A:
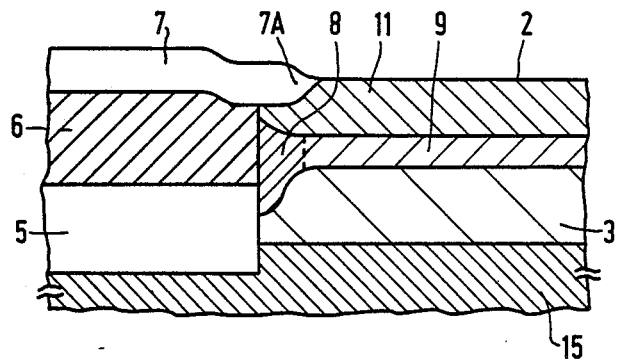
Figure 1B:
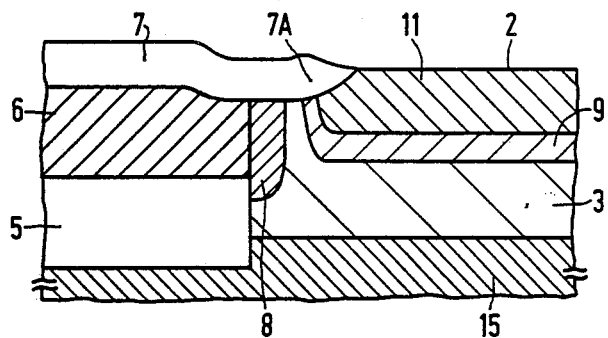

FIGS. 1A and 1B show in greater detail the structure within the region 13 of FIG. 1 bounded by dotted lines for different forms of the "bird's beak" structure 7A.

FIG. 1A shows the situation in which the bird's beak 7A of the countersunk oxide layer 7 is narrow. It can be clearly seen that in this extreme case the active base zone located below the emitter zone 11 is locally, i.e. at the edge, thicker and that the emitter zone 11 adjoins the polycrystalline silicon layer 6 so that the emitter-base pn junction extends partly in polycrystalline material. As is known, both conditions adversely affected the transistor behavior.

FIG. 1B shows the situation in which the bird's beak 7A on the contrary is very wide. In this case, there is a possibility, as appears from the drawing, that the connection between the contact zone 8 and the active base zone 9 is interrupted.

In a semiconductor device according to the invention, these drawbacks, which are due to the fact that the structure near the edge of the polycrystalline silicon layer 6 depends upon the form of the bird's beak at the end of the oxide layer 7, are avoided.

Figure 2:
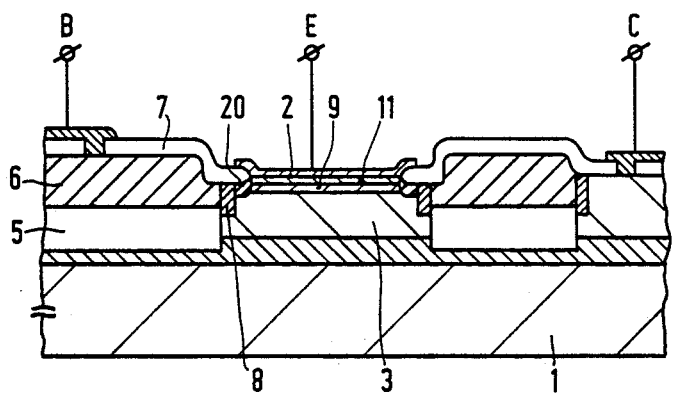
FIG. 2 shows diagrammatically in cross-section a semiconductor device according to the invention.

FIG. 2 shows diagrammatically in cross-section a part of a semiconductor device according to the invention. Corresponding parts are designated therein by the same reference numerals as in FIG. 1, FIG. 1A and FIG. 1B. The device has the same characteristics as that shown in FIGS. 1, 1A and 1B, but the upper side of the poly-crystalline silicon layer 6 is now located at a higher level than the surface 2 of the first region and the contact zone 8 is connected to the semiconductor zone 9 via a more weakly doped intermediate region 20 located in the first region 4 below the second oxide layer 7.

Since the current path between the contact zones 8 and the zone 9 extends via the intermediate region 20 so that the zones 8 and 9 no longer directly adjoin each other and no longer pass one into the other, the problems indicated with reference to FIGS. 1A and 1B are avoided in this case. Moreover, as will be described below, the whole structure can be formed substantially entirely in a self aligned manner. Furthermore, the connection at the side edge of the silicon layer 6 is less deep due to the higher location of the silicon layer, which in this case leads to a lower base-collector capacitance.

The device shown in FIG. 2 can be manufactured according to the invention in the following manner.

The starting material is a substrate having a silicon region 3 of a first, in this embodiment n, conductivity type. An anti-oxidation layer is provided on the surface 2 of the region 3. This layer consists in this embodiment of a 0.05 μm thick silicon oxynitride layer 21 and a 0.1 μm thick silicon nitride layer 22 disposed thereon.

A first layer of a first material, in this embodiment a silicon layer 23 is formed on the anti-oxidation layer 21,22 by deposition of a polycrystalline silicon layers having a thickness of about 1.2 μm from the gaseous phase by the use of conventional techniques. The layer 23 in this embodiment consists of undoped (that is not intentionally doped) silicon.

Figure 3:
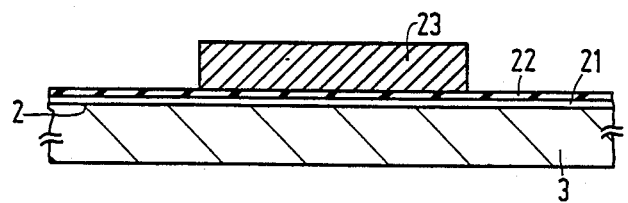
FIGS. 3 to 10 show diagrammatically cross-sections of the device shown in FIG. 2 at successive stages of manufacture according to the invention.

Subsequently, a pattern, in this embodiment in the form of an island, is etched from this silicon nitride layer 23. Thus, the structure shown in cross-section in FIG. 3 is obtained.

Figure 4:
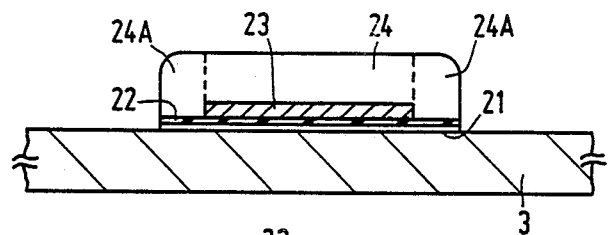

Subsequently, the silicon layer 23 is provided with oxide 24 by thermal oxidation having a thickness of about 1 μm. A part of the silicon layer 23 is then maintained. The oxide 24 forms along the circumference of the layer 23 edge portions 24A, which can be etched selectively with respect to the layer 23. Subsequently, the uncovered part of the thin layers 22 and 21 is removed by selective etching, only a small part of the oxide layer 24 being etched away. Thus, the situation of FIG. 4 is obtained.

Figure 5:
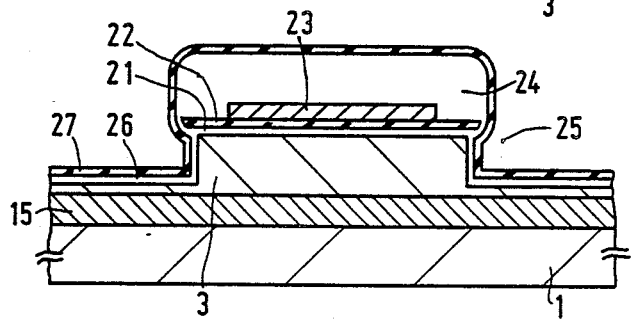

A depression, for example (but not necessarily) in the form of a groove 25, is then etched into the part of the silicon region 3 thus exposed, this depression being shown in part in the cross-section of FIG. 5. The depth of the groove is about 0.8 μm. Preferably, the region 3 is slightly under-etched in order to facilitate subsequent etching steps.

A further anti-oxidation layer consisting of a silicon oxide layer 26 and a silicon nitride layer 27 is now provided on the assembly. Thus, the structure of FIG. 5 is obtained.

Figure 6:
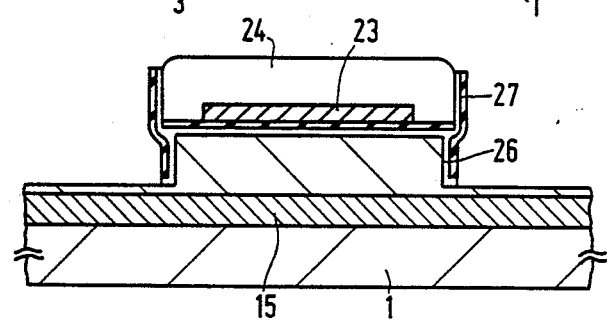
Figure 7:
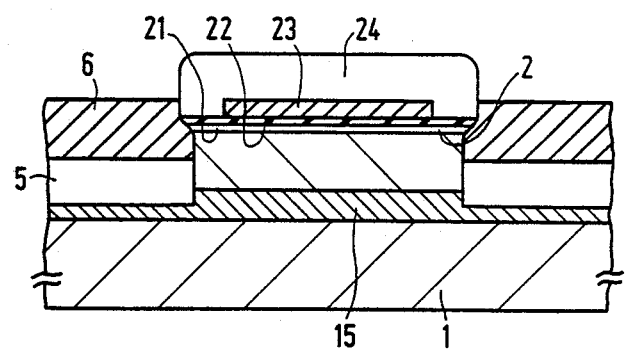

By plasma etching in, for example, a plasma of carbon hydrofluorides, the layers 26 and 27 are then removed from all the surfaces parallel to the surface 2 (cf. FIG. 6). Subsequently, the silicon surfaces not covered by the anti-oxidation layer (26,27) are provided by thermal oxidation with a countersunk first oxide layer 5 (cf. FIG. 7). After the anti-oxidation layer 26,27 has been removed, the groove 25 is filled up to a level above the surface 2 of the silicon region 3 with a highly doped second silicon layer 6 of the second, so in this case the p, conductivity type by deposition and planarization. The structure of FIG. 7 is thus obtained. The layer 6 may be doped during its deposition or at a later stage.

Figure 8:
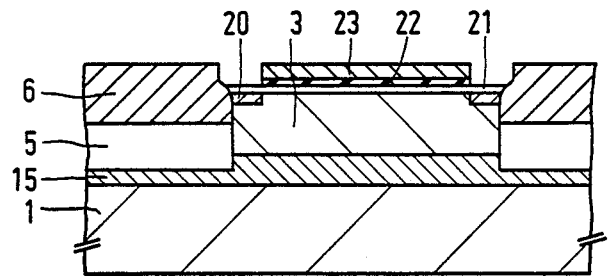
Figure 9:
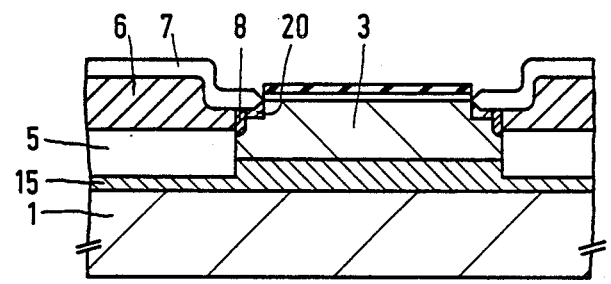

The exposed oxide 24 is now etched away. The lateral dimension of the oxide 24 between the layers 6 and 23 determines the location and the dimensions of the aforementioned "intermediate region" (In this embodiment the intermediate region 20 is formed by then implanting between the silicon layers 6 and 23 acceptor ions, for example boron ions. This implantation may be carried out for the layers 21 and 22. A smaller quantity of implantation energy is required when beforehand at least a part of the anti-oxidation layer 21,22, in this embodiment only the nitride layer 22, is etched away. Thus, the structure shown in FIG. 8 is obtained. Thus, the structure shown in FIG. 8 is obtained. After the undoped silicon 23 has been selectively etched away in a kOH solution, the layer 22 is etched away and the exposed silicon is provided by thermal oxidation with a second oxide layer 7. By diffusion from the highly doped p-type silicon layer 6, a p-type contact layer 8 is then obtained (cf. FIG. 9).

Figure 10:
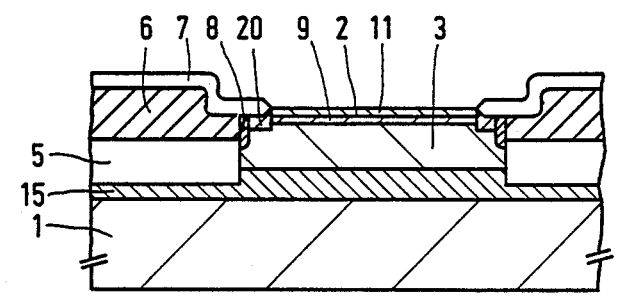

The remaining oxynitride 21 and the nitride 22 are now etched away, whereupon a p-type base zone 9 and an n-type emitter zone 11 are formed in the part of the region 3 thus exposed, for example by ion implantation (cf. FIG. 10). After etching of contact windows in a usual manner and metallization, the device shown in FIG. 2 is obtained. The collector may be contacted, as indicated, outside the island at C; the collector connection extends via the buried layer 15.

Figure 12:
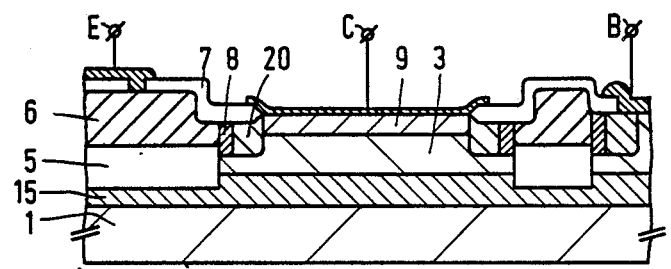
Figure 13:
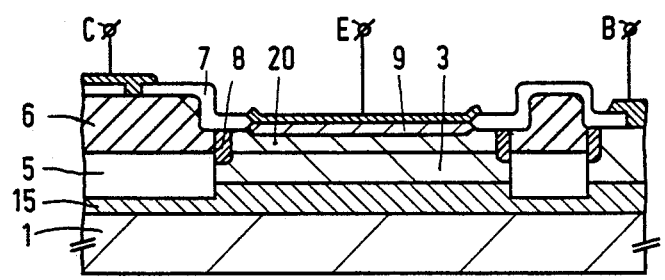
FIG. 13 shows a further embodiment of a semiconductor device according to the invention.
Figure 14:
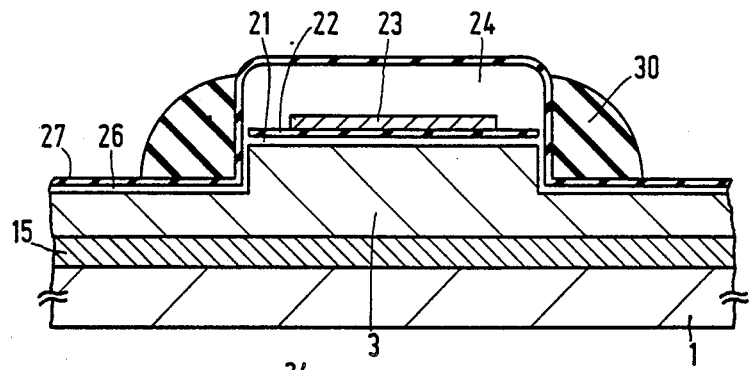
FIGS. 14 to 21 show successive stages of manufacture of another preferred embodiment of a semiconductor device according to the invention.

In the embodiment described above, the intermediate region 20 consisted of a doped p-type zone and the semiconductor circuit element was a vertical bipolar transistor. However, it is also possible to use the invention in a lateral transistor, in which an n-type intermediate region is used, starting, for example, from the same structure of the regions 1, 3 and 15 as in the preceding embodiment. This is illustrated in FIGS. 11, 12 and 13.

Figure 11:
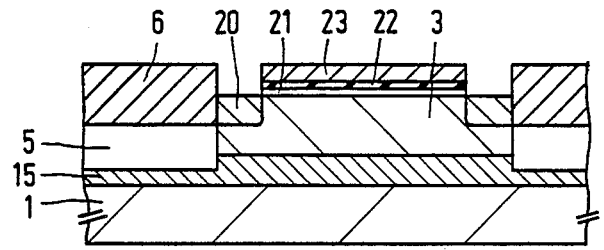
FIGS. 11 and 12 show successive stages of manufacture of another embodiment of a semiconductor device according to the invention.

FIG. 11 shows diagrammatically in cross-section a semiconductor device at the stage of manufacture corresponding to FIG. 8. The difference consists in that in this embodiment the intermediate region 20 is n-type conducting and is constituted by first providing the silicon layer 6 with a phosphorus doping, by diffusing the latter out to form the intermediate zone and by then providing in the layer 6 a strong boron doping, which renders the layer 6 strongly p-type conducting and forms in the same manner as in the preceding embodiment the contact zone 8 by diffusion. The further manufacture takes place in the same manner as indicated with reference to FIGS. 9 and 10. Thus, after etching of contact windows and metallization, the device shown in FIG. 12 is obtained, in which the zones 8, 20 and 9 constitute a lateral high-frequency pnp transistor, of which 8 may be used as emitter zone, 20 may be used as base zone and 9 may be used as collector zone (the emitter and collector zones may of course also be interchanged). The base zone 20 is connected via the regions 3 and 15 to the connection electrode B.

A still further possibility is illustrated with reference to FIG. 13. Also in this case, a lateral high-frequency pnp transistor is formed, but now the region 20 is implanted after formation of the oxide layer 7 and has extended during a subsequent temperature treatment as far as the contact zone 8.

In the embodiments described, a comparatively shallow groove is chosen as boundary of the island-shaped region in which the transistor is situated. If a deeper boundary is desired, for example in order to penetrate through a buried layer located at a comparatively large depth, another structure may advantageously be used, which will be illustrated with reference to FIGS. 14 to 21.

The starting material is the same structure as in the embodiment shown in FIGS. 3 to 10 and the starting point is the situation as shown in FIG. 5. However, in this case a spacer 30 of, for example, photoresist is provided on the structure of FIG. 5 (cf. FIG. 14), for example by covering it with photoresist, then removing the photoresist by means of plasma etching from the major art of the horizontal surfaces.

Figure 15:
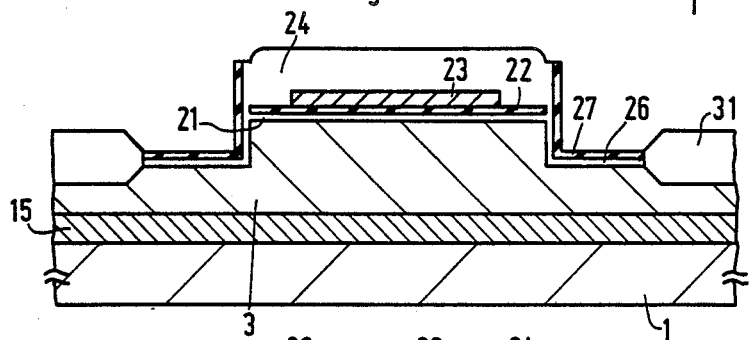
Figure 16:
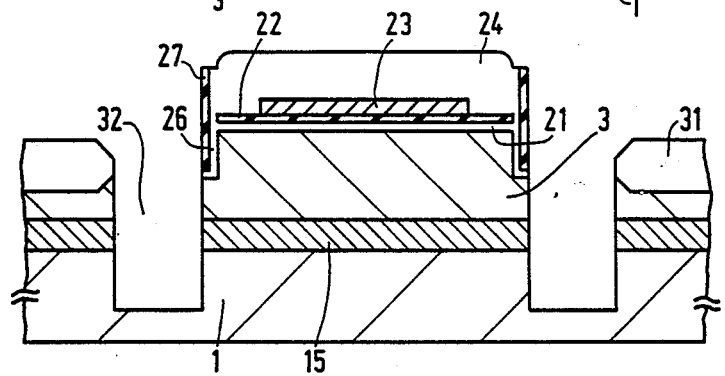

The oxynitride layer 26 and the nitride layer 27 are then removed by etching from the parts not covered by the photoresist 30, after which by thermal oxidation in, for example, wet nitrogen at about 1000° C. the oxide 31 is formed (cf. FIG. 15).

Subsequently, the horizontal parts of the layers 26 and 27 are then selectively removed by plasma etching, after which a groove 32 is etched into the silicon thus exposed, which groove may have an arbitrary depth and may extend through the buried layer 15 (cf. FIG.

16). If desired, a channel stopper zone may be implanted into the bottom of the groove.

Figure 17:
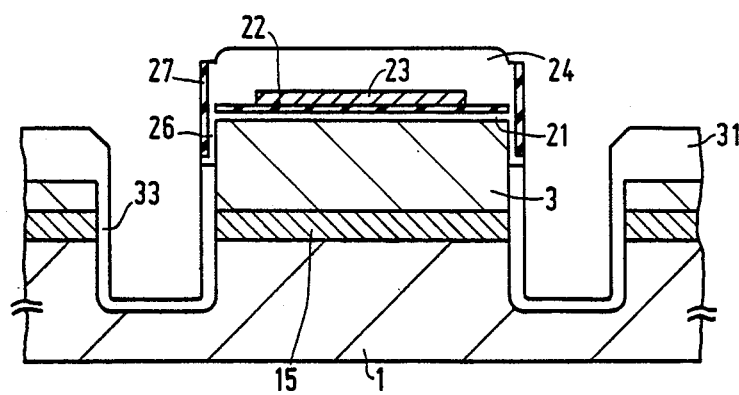
Figure 18:
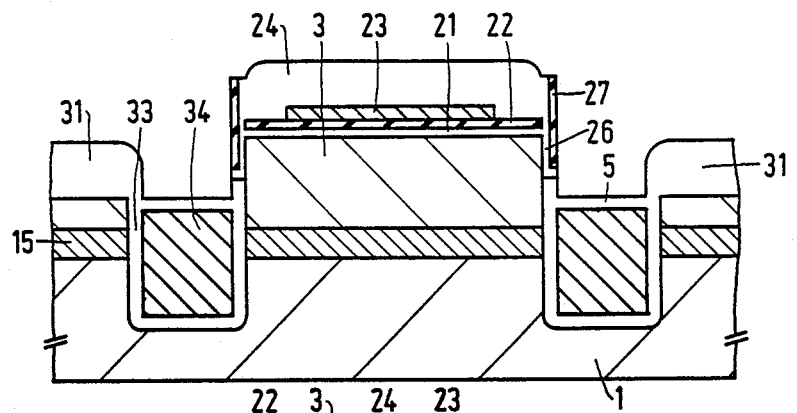

By thermal oxidation, the bottom and the walls of the groove 32 are then provided with an oxide layer 33 (cf. FIG. 17). The groove is then (cf. FIG. 18) filled by deposition of polycrystalline silicon 34 in a usual manner and the excess silicon is removed. By thermal oxidation, the polycrystalline silicon 34 in the groove is provided with an oxide layer 5.

Figure 19:
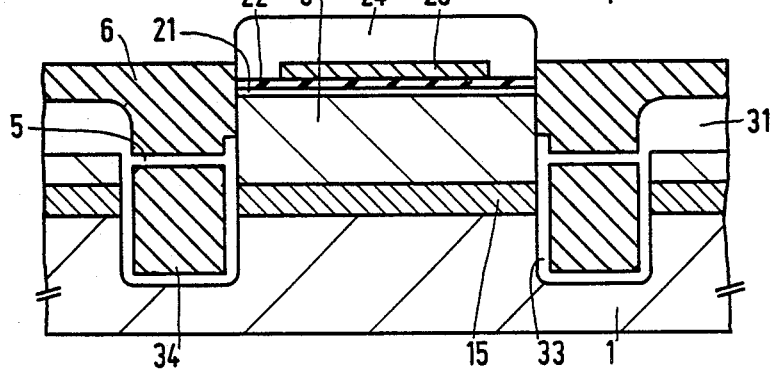
Figure 20:
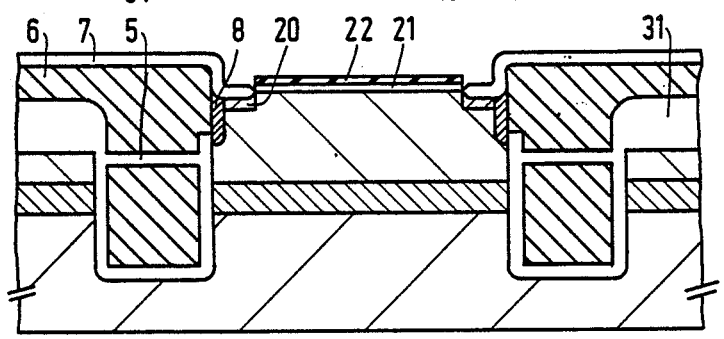
Figure 21:
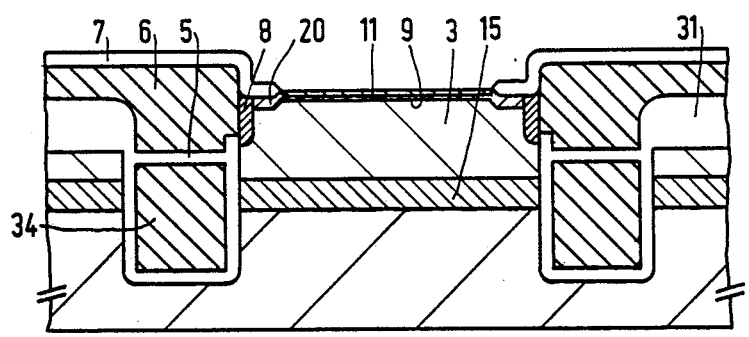

By etching, the remaining parts of the layers 26 and 27 are now removed and a layer of polycrystalline silicon 6 is provided on the assembly. By plasma etching, the parts of the layer 6 present on the oxide 24 are removed so that the situation of FIG. 19 is obtained. The silicon layer 6 has a high p-type doping. This doping may b e realized either during deposition of the silicon or after the silicon has been provided by diffusion or implantation of a dopant.

Subsequently, the oxide 24 is selectively removed by etching and p-type zone 20 is formed (cf. FIG. 20) in the region located between the layers 6 and 23 by ion implantation, as the case may be after the exposed parts of the layers 21 and 22 have been partly removed. Subsequently, after the exposed nitride 22 has been etched away, the silicon 23 is selectively etched away with respect to the strongly p-doped silicon 6 in a KOH solution. The layer 21 is then etched away, after which an oxide layer 7 is formed on the silicon layer 6 by thermal oxidation. During this oxidation, the p-type zone 8 is formed by diffusion from the layer 6.

The layers 21 and 22 are then removed, after which (cf. FIG. 21) dopants are implanted into the silicon thus exposed for forming the p-type base zone 9 and the n-type emitter zone 11. After etching of contact windows into the oxide layer 7 and metallization, the transistor is ready for use. The collector connection may be formed elsewhere on the island 3, as the case may be via a highly doped n-type zone (not shown here) adjoining the buried layer 15. The reference numerals in this embodiment correspond for like parts to those of the preceding embodiments.

Figure 22:
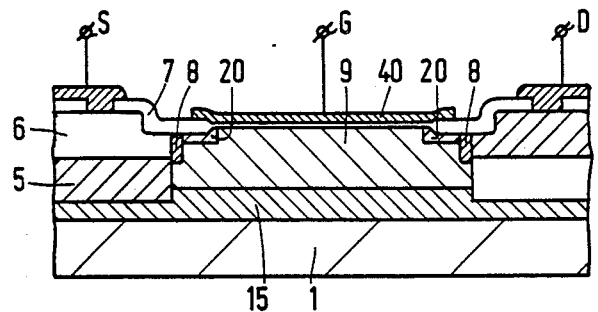
FIG. 22 shows diagrammatically in cross-section a MOS transistor according to the invention.

The invention is not limited to bipolar devices, but may also advantageously be used, for example, in the manufacture of MOS transistors. See FIG. 22, in which corresponding parts are designated by the same reference numerals as in the preceding embodiments and in which the zones 8 and 20, of which the former is highly doped and the latter is weakly doped, but which are both of the same conductivity type, constitute source and drain zones of a MOS transistor. Of course, an additional mask must ensure that the zones 8 and 20 and the layer 6 are present only locally and are not coherent with each other. The gate electrode layer 40 may be made, for example, of polycrystalline silicon. Also in this embodiment, like in the preceding embodiments, the contact zone 8 is connected via an intermediate zone 20 (the "extended source" or the "extended drain") to a semiconductor zone 9 (in this case the channel region) of the MOS transistor, this channel region practically being bounded by the edge of the oxide layer 7.

In the preceding embodiments, during the manufacture a first layer 23 of silicon was used, which was provided with edge portions 24A of silicon oxide. These edge portions were obtained by oxidizing the layer 23 throughout its surface. However, it is also possible to oxidize the silicon pattern 23 only at the edge by providing its upper side with an anti-oxidation layer.

Figure 23:
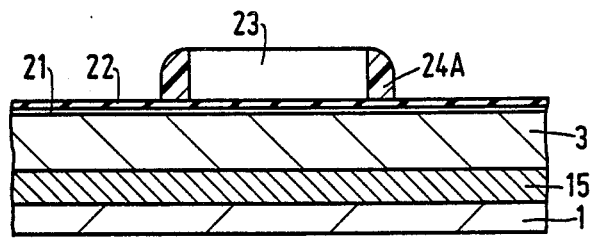
FIGS. 23 to 25 show successive stages of manufacture of a semiconductor device according to a variation of a method in accordance with the invention.

Moreover, it is possible to use other materials both for the layer 23 and for the edge portions 24A. For example, the layer 23 may consist not of silicon, but of silicon oxide, which is patterned in the same manner as the silicon layer 23 used in the embodiments. The edge portions 24A, which must etchable with respect to the layer 23, may then consist, for example, of a boron phosphorus silicate glass, which is pyrolytically deposited and is then removed by means of plasma etching, except for edge portions along the circumference of the oxide layer 23. Thus, the situation of FIG. 23 is obtained.

Figure 24:
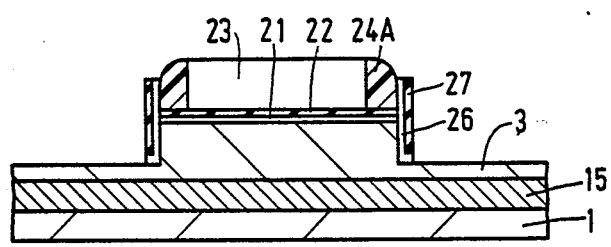
Figure 25:
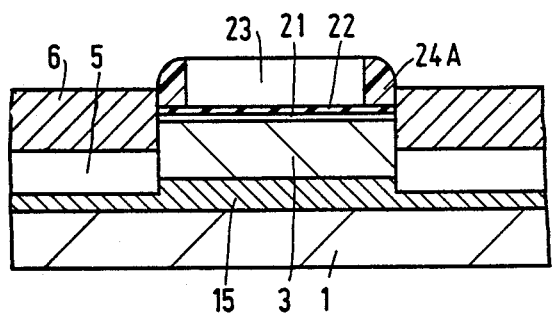

The process may then be continued in the same manner as described with reference to FIGS. 4 to 10. See, for example, FIG. 24, which corresponds to FIG. 6, and FIG. 25, which corresponds to FIG. 7.

It should further be noted that in all embodiments the conductivity types may be replaced (all simultaneously) by the opposite conductivity types and that, if desired, anti-oxidation layers other than silicon oxynitride/silicon nitride combinations may also be used.

According to a variation of the method, starting from the situation shown in FIG. 7, alternatively, first only a part of the oxide layer 24 may be removed, after which the surface of the silicon layer 6 is converted into a metal silicide (for example tungsten silicide). After the layers 24, 22, 23 and 21 have successively been removed, the layer 6 has then doped with boron. This is the advantage that before this boron doping process steps, for example, oxidation steps, may be carried out at elevated temperature without the boron diffusing from the layer 6, while moreover the quantity of boron required is smaller.

Finally, it should be noted that, in order to improve the conduction, the layer 6 may be provided also by means of usual techniques with a surface layer consisting of a metal silicide.

What is claimed is:

1. A semiconductor device comprising a monocrystalline semiconductor body of silicon, in which at least a first region of a first conductivity type is laterally bounded by a second region comprising a countersunk oxide layer, a highly doped silicon layer of the second conductivity type opposite to that of the first conductivity type disposed on said oxide layer, and a second oxide layer which is disposed on said oxide layer, and a second oxide layer which is disposed on said highly doped silicon layer, is at least partly countersunk into it and extends into the first region, a highly doped contact zone of the second conductivity type, said silicon layer adjoining said highly doped contact zone of the second conductivity type, a semiconductor zone formed in said first region which is substantially bounded by the edge of the second oxide layer and forms part of a semiconductor circuit element, said contact zone being electrically coupled to said semiconductor zone and said silicon layer being connected to a connection conductor, the upper side of the silicon layer being located at a higher level than the surface of the first region, and further comprising an intermediate region located in the first region at least in part directly below the second oxide layer and having a lower doping concentration than that of the contact zone, said contact zone being electrically coupled to said semiconductor zone by said intermediate region.

2. A semiconductor device as claimed in claim 1, characterized in that the intermediate region is bounded by the contact zone and by the edge of the second oxide layer.

3. A semiconductor device as claimed in claim 1 or 2, characterized in that the intermediate region comprises by a semiconductor region of the second conductivity type.

4. A semiconductor device as claimed in claim 3, characterized in that the semiconductor zone is the base zone of a vertical bipolar transistor.

5. A semiconductor device as claimed in claim 1 or 2, characterized in that the intermediate region is constituted by a semiconductor zone of the first conductivity type having a higher doping concentration than that of the first region and forming the base zone of a lateral bipolar transistor, the contact zone and the said semiconductor zone of the second conductivity type forming emitter and collector zones of the transistor.

* * * * *